United States Patent
Ota et al.

(10) Patent No.: US 8,575,476 B2
(45) Date of Patent: Nov. 5, 2013

(54) CIS SOLAR CELL AND METHOD FOR MANUFACTURING THE SAME

(75) Inventors: Morihisa Ota, Kusatsu (JP); Taizo Kobayashi, Uji (JP); Akihiro Funamoto, Kyoto (JP); Shigeru Aoyama, Kizugawa (JP)

(73) Assignee: OMRON Corporation, Kyoto (JP)

( * ) Notice: Subject to any disclaimer, the term of this patent is extended or adjusted under 35 U.S.C. 154(b) by 395 days.

(21) Appl. No.: 12/668,668

(22) PCT Filed: Jul. 14, 2008

(86) PCT No.: PCT/JP2008/062695
§ 371 (c)(1),
(2), (4) Date: Jun. 3, 2010

(87) PCT Pub. No.: WO2009/011333
PCT Pub. Date: Jan. 22, 2009

(65) Prior Publication Data
US 2010/0269906 A1 Oct. 28, 2010

(30) Foreign Application Priority Data
Jul. 13, 2007 (JP) ................................. 2007-184196

(51) Int. Cl.
*H01L 31/00* (2006.01)
(52) U.S. Cl.
USPC .......................................................... 136/256
(58) Field of Classification Search
USPC .................................. 136/252, 256
See application file for complete search history.

(56) References Cited

U.S. PATENT DOCUMENTS

| 4,530,739 A | 7/1985 | Hanak et al. |
| 5,913,986 A * | 6/1999 | Matsuyama ................... 136/255 |
| 6,132,585 A | 10/2000 | Midorikawa et al. |
| 6,750,394 B2 | 6/2004 | Yamamoto et al. |
| 7,053,294 B2 | 5/2006 | Tuttle et al. |
| 7,122,398 B1 * | 10/2006 | Pichler ............................. 438/66 |
| 7,634,623 B2 | 12/2009 | Raad |
| 2001/0037825 A1 * | 11/2001 | Nakano et al. ................. 136/256 |
| 2002/0134425 A1 | 9/2002 | Yamamoto et al. |
| 2003/0234181 A1 * | 12/2003 | Palumbo et al. ............... 205/115 |

(Continued)

FOREIGN PATENT DOCUMENTS

| DE | 69311209 T2 | 1/1998 |
| DE | 10006823 A1 | 8/2001 |

(Continued)

OTHER PUBLICATIONS

Office Action issued in corresponding Chinese patent application 200880024493.5 mailed on Feb. 9, 2011 (5 pages).

(Continued)

*Primary Examiner* — Eli Mekhlin
(74) *Attorney, Agent, or Firm* — Osha Liang LLP

(57) ABSTRACT

An alloy substrate formed on an alloy of Ni and Mo is formed by electroforming. The alloy substrate has graded composition in which alloy composition varies in a thickness direction thereof. A lower surface side is mainly composed of Ni, and a upper surface side is mainly composed of Mo. An upper surface of the alloy substrate is formed with a large number of minute and pyramidal unevenness having high light scattering property. A CIS light absorbing layer is formed on the upper surface of the alloy substrate, and an upper electrode is provided thereabove.

7 Claims, 11 Drawing Sheets

(56) References Cited

U.S. PATENT DOCUMENTS

| | | |
|---|---|---|
| 2005/0028861 A1* | 2/2005 | Aoki et al. ............... 136/256 |
| 2005/0050289 A1 | 3/2005 | Raad |
| 2008/0308147 A1* | 12/2008 | Lu et al. ............... 136/256 |

FOREIGN PATENT DOCUMENTS

| | | |
|---|---|---|
| JP | 62-105485 A | 5/1987 |
| JP | 63-041082 A | 2/1988 |
| JP | 02-000382 A | 1/1990 |
| JP | 05-055611 A | 3/1993 |
| JP | 05-267704 A | 10/1993 |
| JP | 09-082991 A | 3/1997 |
| JP | 11-135819 A | 5/1999 |
| JP | 11-224953 A | 8/1999 |
| JP | 2001-345460 A | 12/2001 |
| WO | 03/007386 A1 | 1/2003 |

OTHER PUBLICATIONS

Office Action issued Dec. 7, 2011 in corresponding German patent application 112008001828.6 with translation (13 pages).

International Search w/translation from PCT/JP2008/062695 dated Aug. 19, 2008 (4 pages).

Written Opinion from PCT/JP2008/062695 dated Aug. 19, 2008 (4 pages).

Espacenet Abstract Publication No. JP9082991A dated Mar. 28, 1997 (1 page).

Espacenet Abstract Publication No. JP5267704A dated Oct. 15, 1993 (1 page).

Espacenet Abstract Publication No. JP11224953A dated Aug. 17, 1999 (1 page).

Espacenet Abstract Publication No. JP63041082A dated Feb. 22, 1988 (1 page).

Espacenet Abstract Publication No. JP5055611A dated Mar. 5, 1993 (1 page).

Espacenet Abstract Publication No. JP2000382A dated Jan. 5, 1990 (1 page).

Espacenet Abstract Publication No. JP2001345460A dated Dec. 14, 2001 (1 page).

Espacenet Abstract Publication No. JP11135819A dated May 21, 1999 (1 page).

Spanish Publication and State of Art Report issued in Spanish Application No. 201090002, dated Mar. 22, 2013, and English translation thereof (15 pages).

* cited by examiner

--Prior Art--

--Prior Art--

Fig. 7(c)

CIS SOLAR CELL AND METHOD FOR MANUFACTURING THE SAME

TECHNICAL FIELD

The present invention relates to a CIS solar cell and a method for manufacturing the same. Specifically, the present invention relates to a CIS solar cell comprising CIGS, CIGSS, CIS or the like as the light absorbing layer thereof, and to a method for manufacturing the same.

BACKGROUND ART

Solar cells include a monocrystalline silicon solar cell, a polycrystalline silicon solar cell, an amorphous silicon solar cell (these are silicon solar cells), a GaAs solar cell, a CdS/CdTe solar cell, a CIS solar cell (these are compound solar cells), a dye-sensitized solar cell (organic solar cell), etc.

Of those, a CIS solar cell is polycrystalline and is therefore favorable for being upsized or mass-produced, and is characterized in that its forbidden band width can be freely varied depending on the material thereof and that it has a theoretical conversion efficiency (31%) on the same level as the theoretical conversion efficiency of a silicon solar cell and has a lifetime (about 20 years) on the same level as that of a silicon solar cell. Accordingly, this is specifically noted as a potential solar cell, and also in Japan, mass-production of CIS solar cells has been started.

The CIS solar cell is a thin-film polycrystalline solar cell in which a group compound comprising Cu, In, Ga, Ag, Se, S and the like and referred to as a chalcopyrite compound is used as a material of the light absorbing layer thereof, and typically includes those comprising $Cu(In,Ga)Se_2$ [GIGS], $Cu(In,Ga)(Se,S)_2$ [CIGSS], $CuInS_2$ [CIS] or the like.

FIG. 1 is a perspective view showing a general structure of a CIS solar cell 11. The CIS solar cell 11 comprises a lower electrode 13 of Mo provided on a substrate 12 of glass (soda lime glass), a light absorbing layer 14 of GIGS or the like formed on the lower electrode 13, and a transparent upper electrode 16 of ZnO or the like provided thereon via a buffer layer 15 of CdS or the like. Concretely, after the substrate 12 is washed, Mo or the like is sputtered on the upper surface of the substrate 12 to form the lower electrode 13 thereon, and further a chalcopyrite compound such as GIGS is deposited on the lower electrode 13 through simultaneous vapor deposition to form the light absorbing layer 14 thereon. Next, the substrate is dipped in a CdS solution to thereby grow the buffer layer 15 on the upper surface of the light absorbing layer 14, and ZnO or the like is sputtered onto the buffer layer 15 to form the upper electrode 16 thereon.

On the other hand, as illustrated in FIG. 2, it is well-known a silicon solar cell 21 which comprises a lower electrode 23 of ZnO formed on an electroformed Ni substrate 22 having, on its upper surface, unevenness 27 having a mean roughness of from 0.1 to 10 µm, a light absorbing layer of amorphous silicon formed on the lower electrode 23, and a transparent upper electrode 26 of ZnO provided thereon. This type of conventional art is disclosed in Japanese Patent Publication No. 2001-345460A (Patent Document 1).

In the silicon solar cell 21 of this type, the surface of the lower electrode 23 also has unevenness 28 owing to the unevenness 27 formed on the surface of the electroformed substrate 22. Accordingly, light 29 incident on the light absorbing layer 24 through the upper electrode 26 is scattered by the unevenness 28 and is then trapped and absorbed by the light absorbing layer 24, and the conversion efficiency of the silicon solar cell 21 is thereby increased. As the electroformed substrate 22 is used, unevenness can be formed on the surface of the substrate with low cost.

Patent Document 1: Japanese Patent Publication No. 2001-345460A

DISCLOSURE OF THE INVENTION

Problems to be Solved by the Invention

In view of the configuration of the silicon solar cell 21 shown in FIG. 2, it may be considered that, even in the CIS solar cell shown in FIG. 1, the conversion efficiency thereof can be enhanced by providing unevenness on the lower electrode 13.

In fact, however, minute unevenness could not be formed on the surface of the lower electrode 13 in the CIS solar cell 11. In the case of a silicon solar cell, the thickness of the lower electrode 23 is thin and around 0.05 µm (50 nm), so that the unevenness 27 formed on the surface of the electroformed substrate 22 could directly appear as the unevenness 28 on the surface of the lower electrode 23. On the other hand, in the case of the CIS solar cell 11, since Mo is used as the lower electrode 13 for ohmic junction with the light absorbing layer 14 and for lattice constant matching with the light absorbing layer 14, the thickness of the lower electrode 13 must be around 1 µm. Accordingly, as shown in FIG. 3, even though the lower electrode 13 of Mo is formed on the substrate 12 having minute unevenness 17, the unevenness 17 of the substrate 12 will not cause the upper surface of the lower electrode to be uneven. Even if the unevenness could appear on the upper surface of the lower electrode 13, it would be rather flat as compared with the unevenness 17. Therefore, light could not be well scattered by the lower electrode 13 and there is a problem that the use efficiency of the light scattered in the lower electrode 13 becomes poor.

One or more embodiments of the present invention provide a CIS solar cell in which unevenness having a high light-scattering effect can be formed on the surface of the lower electrode positioned on the back of the light absorbing layer therein, and to provide a method for manufacturing the same.

How to Solve the Problems

According to the invention, there is provided a CIS solar cell, comprising:
a substrate having an upper surface formed with unevenness;
a light absorbing layer adapted to absorb light; and
an upper electrode disposed above the light absorbing layer, wherein:
the light absorbing layer is disposed on the substrate and in contact with the unevenness, so that the substrate serves as a lower electrode.

In the CIS solar cell of the invention, the upper surface of the substrate has the unevenness and the light absorbing layer is provided so as to be in contact with the upper surface of the substrate. Thus, of the light incident on the light absorbing layer, one having reached the upper surface of the substrate is scattered by the unevenness and is absorbed by the light absorbing layer. Hence, the conversion efficiency of the solar cell is increased. In addition, since the unevenness is formed directly on the substrate, the unevenness can be so formed as to have a sharp profile with accuracy. Moreover, since the substrate serves as a lower electrode (ohmic electrode), it is possible to avoid a situation that the unevenness is caused to be smoothed or flattened by additionally forming a lower electrode on the unevenness.

In an embodiment of the CIS solar cell of the invention, the substrate includes Mo in the vicinity of the upper surface being contact with the light absorbing layer. In this embodiment, an ohmic junction can be established between the surface of the substrate including Mo and the light absorbing layer. Thus, the substrate can be caused to serve as a lower electrode (ohmic electrode). Moreover, since the surface of the substrate includes Mo, the surface of the substrate enables lattice constant matching when the light absorbing layer is grown on the surface of the substrate. Thus, a light absorbing layer of good quality can be formed.

In another embodiment of the CIS solar cell of the invention, the substrate is comprised of an alloy. In this embodiment, the linear expansion coefficient can be controlled by controlling the alloy composition. In a case where metal plate are stuck on one another, warpage may be caused by temperature change due to the bimetal effect. However, since the substrate is alloyed, the warpage of the substrate due to temperature change may be reduced. Accordingly, the linear expansion coefficient of the substrate can be almost equal to the linear expansion coefficient of the light absorbing layer. Thus, the light absorbing layer can be prevented from cracking or peeling.

In still another embodiment of the CIS solar cell of the invention, alloy composition of an upper side of the substrate is different from alloy composition of a lower side of the substrate. In this embodiment, the characteristics of the substrate as a whole and the characteristics thereof as a lower electrode can be respectively controlled. For example, in the surface, the concentration of the metal material suitable to a lower electrode (ohmic electrode) is increased and, as a whole, the linear expansion coefficient of the substrate is made to be equal to that of the light absorbing layer.

In still another embodiment of the CIS solar cell of the invention, the substrate is comprised of an alloy including Mo. In this embodiment, since the substrate includes Mo, the ohmic junction can be established between the substrate and the light absorbing layer.

In particular, in a case where the substrate is comprised of an alloy of Ni and Mo, since Ni has a larger linear expansion coefficient than that of the light absorbing layer and Mo has a smaller linear expansion coefficient than that of the light absorbing layer, the linear expansion coefficient of the substrate may be made to be almost equal to the linear expansion coefficient of the light absorbing layer by controlling the alloying ratio as a whole. Similarly, in a case where the substrate is comprised of an alloy of Co and Mo, since Co has a larger linear expansion coefficient than that of the light absorbing layer and Mo has a smaller linear expansion coefficient than that of the light absorbing layer, the linear expansion coefficient of the substrate may be made to be almost equal to the linear expansion coefficient of the light absorbing layer by controlling the alloying ratio as a whole.

In still another embodiment of the CIS solar cell of the invention, Mo concentration of the substrate becomes higher from a lower surface side to the upper surface being contact with the light absorbing layer. In this embodiment, since the Mo concentration is the largest at the surface of the substrate, the ohmic junction can be established between the surface of the substrate and the light absorbing layer. Thus, the substrate can be used as a lower electrode (ohmic electrode).

In still another embodiment of the CIS solar cell of the invention, the unevenness is formed by pyramidal convexes or concaves. The scattering condition of incident light can be readily controlled by controlling the height and the width or the apex angle of the pyramidal unevenness.

In still another embodiment of the CIS solar cell of the invention, an apex angle of the pyramidal convexes or concaves is 110 degrees. In this embodiment, the light path length of the light staying within the light absorbing layer can be made the longest. Thus, light can be more efficiently absorbed by the light absorbing layer and the conversion efficiency is enhanced.

In still another embodiment of the CIS solar cell of the invention, height of the unevenness is no greater than thickness of the light absorbing layer. In this embodiment, the unevenness will not penetrate the light absorbing layer. Thus, the thinnest part of the light absorbing layer is prevented from being too much thinner, and the light absorbing layer can absorb light efficiently.

In still another embodiment of the CIS solar cell of the invention, the substrate is formed by electroforming. In this embodiment, since the substrate is formed by the electroforming, the throughput in forming the unevenness can be enhanced, and the substrate can be processed with low cost to form unevenness thereon. In addition, since the substrate serving as a lower electrode is formed by the electroforming, sharp unevenness can be formed on the lower electrode (the surface of the substrate).

According to the invention, there is also provided a method of manufacturing the CIS solar cell as set forth in claim 1, comprising:

subjecting a matrix die on which an inverted profile of the unevenness is formed to electroforming to deposit a substrate material on an upper surface of the matrix die;

removing the matrix die from a substrate formed on the upper surface of the matrix die;

forming the light absorbing layer on the upper surface of the substrate; and forming the upper electrode above the light absorbing layer.

According to the method for manufacturing the CIS solar cell of the invention, the substrate having the unevenness can be formed by depositing the substrate material on the upper surface of the matrix die formed with the inverted profile of the unevenness, by the electroforming. Thus, the substrate can be formed with low cost but high throughput. In addition, since the substrate is formed by the electroforming, it is possible to enjoy the advantage of the electroforming which is superior in patternability characteristic. Thus, unevenness having a sharp profile can be formed.

The means for solving the above-mentioned problems in the invention are characterized by above-mentioned constitutive elements as combined suitably, and the invention enables a lot of variations of such combinations of those constitutive elements.

BRIEF DESCRIPTION OF THE DRAWINGS

FIGS. 7(a) to 7(g) are views showing process for manufacturing the alloy substrate by electroforming.

DESCRIPTION OF REFERENCE NUMERALS

Figure 1:
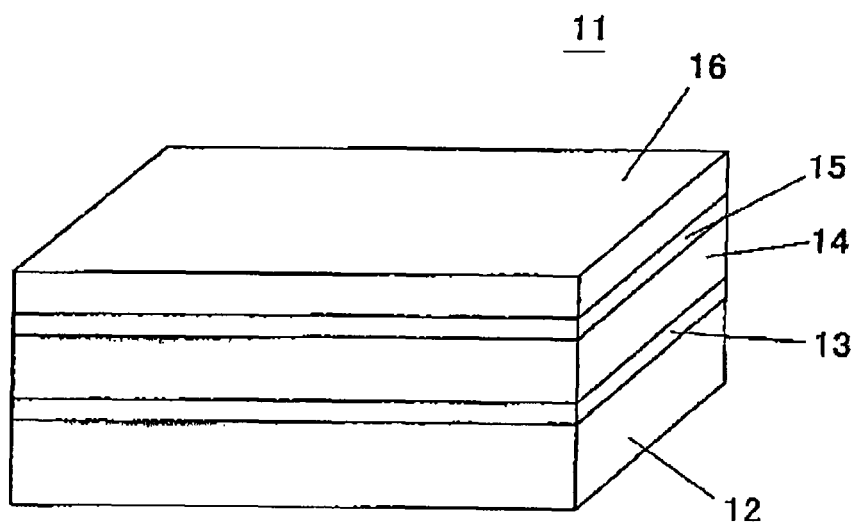
FIG. 1 is a perspective view showing a general structure of a CIS solar cell.
Figure 2:
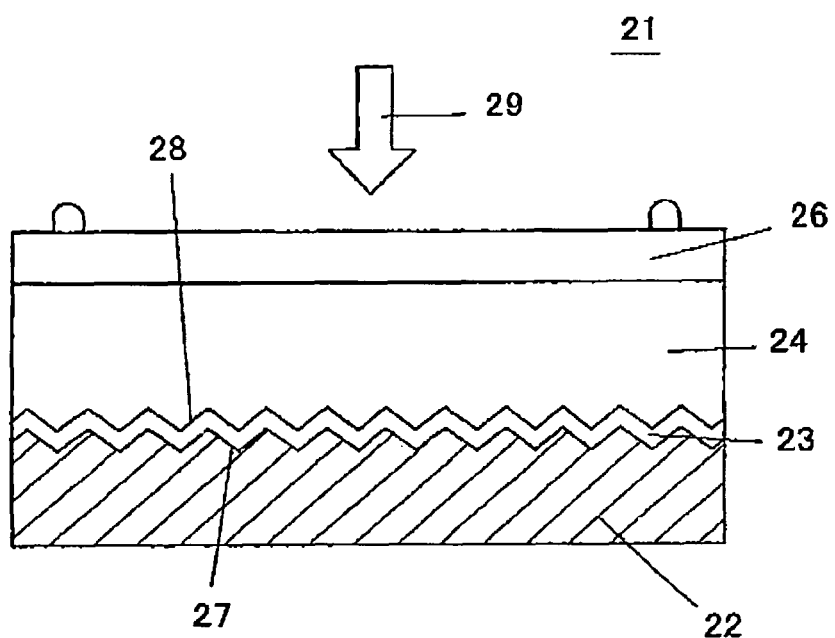
FIG. 2 is a section view schematically showing a structure of a silicon solar cell.
Figure 3:
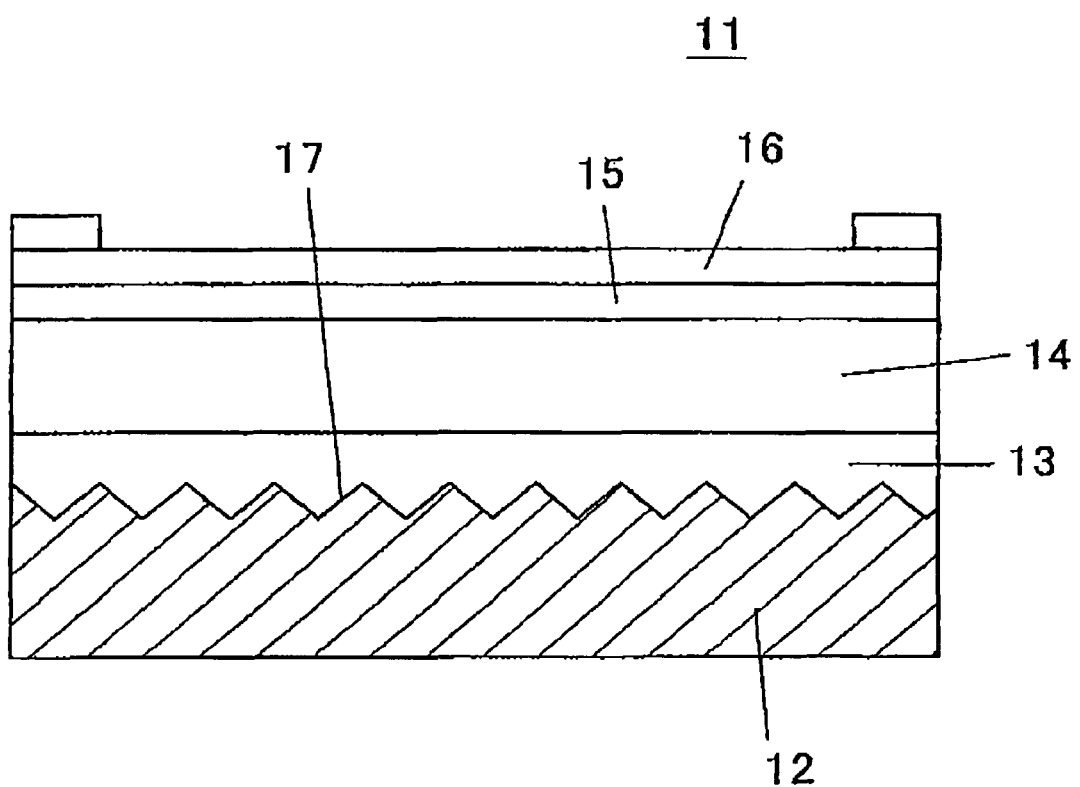
FIG. 3 is a section view schematically showing a CIS solar cell in which unevenness is formed on a substrate.

31: CIS solar cell
32: alloy substrate
33: light absorbing layer
34: buffer layer
35: upper electrode
36: lead electrode
37: unevenness
39: matrix die
40: inverted profile

BEST MODE FOR CARRYING OUT THE INVENTION

Preferred modes of carrying out the invention are described below with reference to the accompanying drawings. The drawings are all schematic views in which the dimensions differ from actual dimensions. The dimensional ratio also differs from an actual ratio, and for example, the unevenness of the alloy substrate are drawn larger than the actual dimensions in an exaggerated manner.

First Embodiment

Figure 4:
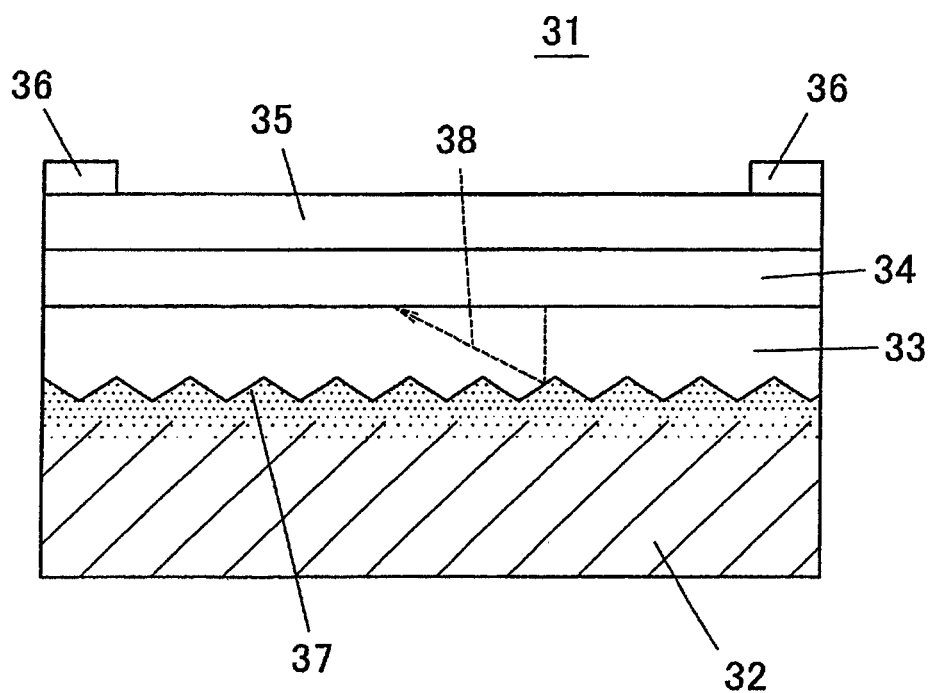
FIG. 4 is a section view schematically showing a CIS solar cell according to a first embodiment of the invention.

The constitution of a CIS solar cell 31 according to a first embodiment of the invention will be described with reference to FIG. 4. The CIS solar cell 31 comprises a light absorbing layer 33 of a CIS compound (chalcopyrite compound) such as CIGS, CIGSS or CIS formed on an alloy substrate 32 formed by an electroforming method, a buffer layer 34 is formed on the light absorbing layer 33 and a transparent upper electrode 35 is formed on the buffer layer 34. On the upper surface of the upper electrode 35, the cell has a pair of lead electrodes 36. In one typical example, the alloy substrate is an alloy of Ni and Mo, and has a thickness of around 50 μm. The light absorbing layer 33 is formed of CIGS to have a thickness of from 2 μm to 3 μm. The buffer layer 34 is formed of CdS or the like to have a thickness of from 0.05 μm (50 nm) to 0.1 μm (100 nm). The upper electrode 35 is formed of ZnO or the like to have a thickness of 0.6 μm (600 nm).

The alloy substrate 31 is an alloy of Ni and Mo, and its thickness is preferably within a range of from 10 μm to 500 μm. Further, in consideration of the strength and the weight thereof, the thickness of the alloy substrate 32 is preferably within a range of from 20 μm to 100 μm, and in particular, from the viewpoint of the structural strength and mechanical strength for handling thereof, the thickness is preferably around 50 μm. The alloying composition of the alloy substrate 32 varies in the thickness direction of the alloy substrate 32, so that the substrate has a concentration gradient. Specifically, the lower part of the alloy substrate 32 is formed of Ni, and the Mo concentration gradually increases toward the upper surface side thereof, so that the alloy substrate 32 is formed of an Mo layer or an Mo-rich layer in the vicinity of the upper surface thereof. For example, in a case where the thickness of the alloy substrate 32 is around 50 μm as in the above, the surface region having a thickness of 1 μm or so is an Mo layer or an Mo-rich layer, and the layer of around 49 μm therebelow is an Ni layer or an Ni-rich layer; and between the two, Mo and Ni diffuse each other.

To that effect, the alloy substrate 32 is an alloy of Ni and Mo, but the surface of the alloy substrate 32 is formed of Mo so that an ohmic junction can be established between the surface of the alloy substrate 32 and the light absorbing layer 33, so that the alloy substrate 32 or its surface serves as a lower electrode. In other words, the surface of the alloy substrate 32 must have an Mo concentration enough for ohmic junction with the light absorbing layer. In addition, since the surface of the alloy substrate 32 is Mo or rich in Mo, it enables lattice constant matching between the surface of the alloy substrate 32 and the light absorbing layer 33 when the light absorbing layer 33 of a CIS compound is grown on the surface. Accordingly, a light absorbing layer 33 (polycrystalline thin film) of good quality can be grown thereon.

Figure 5:
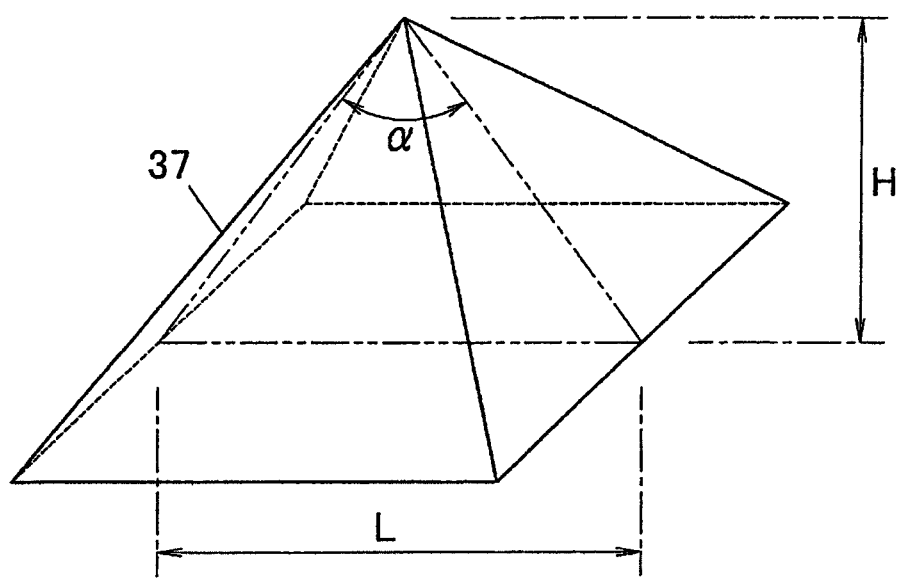
FIG. 5 is a perspective view showing a part of unevenness formed on a surface of an alloy substrate of the solar cell of FIG. 4.

Almost entire of the upper surface of the alloy substrate 32, the unevenness 37 is formed, and the unevenness 37 is constituted by a large number of minute convexes or concaves. For example, as shown in FIG. 5, one convex 37 has a pyramidal shape. The convex 37 is so designed that the apex angle α defined in a plane orthogonally intersecting with two opposing slope faces of the pyramidal shape and including an apex of the pyramidal shape is about 110°. Further, the height H of the convex 37 is at most a half of the thickness of the light absorbing layer 33. For example, the convex 37 is preferably so formed that its height H is from 0.01 μm (10 nm) to 1.5 μm, and the length L of one side of the bottom is from 0.6 μm to 3 μm. The surface of the convex 37 is made to be a mirror surface. The dimension and the arrangement of the unevenness 37 may be at random.

Figure 6:
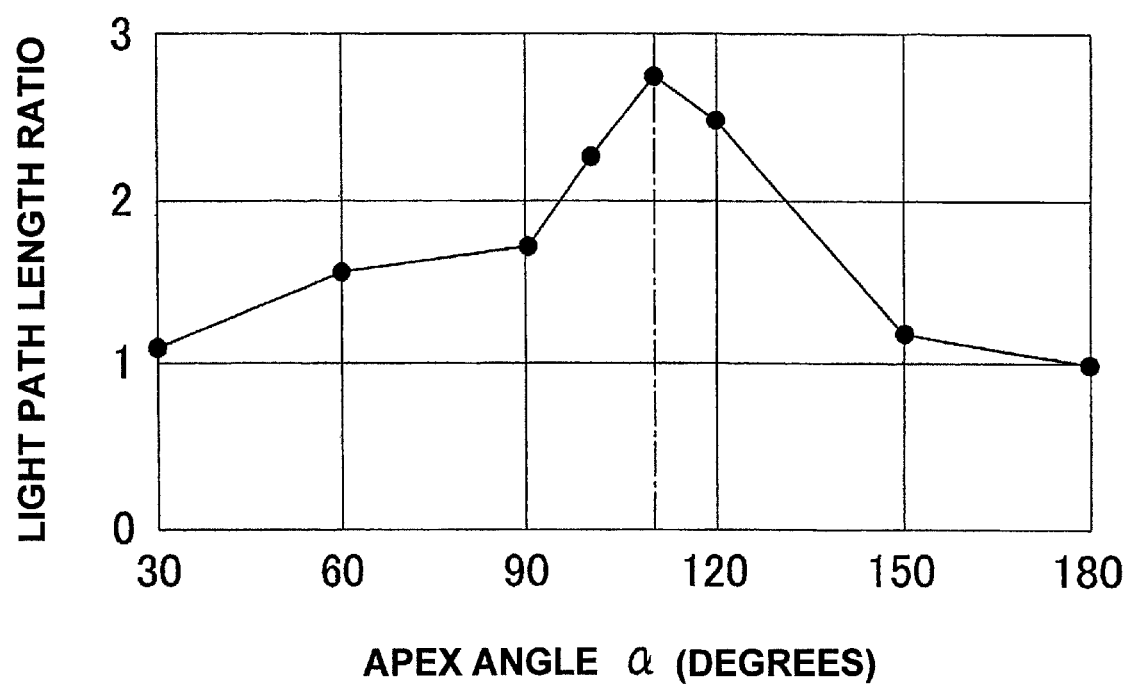
FIG. 6 is a graph showing a result of simulation of the relationship between an apex angle α of a pyramidal convex which is defined in a plane orthogonally intersecting with two opposing slope faces thereof and including an apex thereof, and a light path length of light incident on an upper surface of a light absorbing layer and reflected by the unevenness to go out from the upper surface of the light absorbing layer.

FIG. 6 shows a result of simulation of the relationship between the apex angle α of the convex 37 defined in the plane orthogonally intersecting with the two opposing slope faces of the pyramidal convex 37 and including the apex thereof (see FIG. 5), and the light path length of the light 38 incident through the upper surface of the light absorbing layer 33 and reflected by the unevenness 37 to go out from the upper surface of the light absorbing layer 33. As is apparent from this drawing, the light path length through the light absorbing layer 33 becomes the longest when the apex angle α is about 110°. Accordingly, in a case where the apex angle α of the convex 37 is about 110°, the distance that the light stays within the light absorbing layer 33 can be made the longest so that light can be absorbed by the light absorbing layer 33 most efficiently to thereby attaining better conversion efficiency.

In the alloy substrate 32, since Ni and Mo are alloyed so that the composition thereof gradually varies, there hardly occurs warpage with temperature change owing to the difference in linear thermal expansion coefficient as compared with a case where an Mo layer is merely laminated on an Mo layer (laminate structure). Accordingly, at the film-formation temperature (400° C. to 550° C.) during the formation of the light absorbing layer 33 on the alloy substrate 32, the light absorbing layer 33 hardly peels away from the alloy substrate 32.

The linear expansion coefficient of the alloy substrate 32 as a whole is made to be equal to the linear expansion coefficient of the light absorbing layer 33 in order that the light absorbing layer 33 is not cracked with temperature change owing to the difference in the thermal expansion coefficient between the alloy substrate 32 and the light absorbing layer 33. For example, in a case where the light absorbing layer is CIGS, its linear expansion coefficient is from $9 \times 10^{-6}$/° C. to $10 \times 10^{-6}$/° C. The linear expansion coefficient of Ni is $13 \times 10^{-6}$/° C., and the linear expansion coefficient of Mo is $5.2 \times 10^{-6}$/° C., so that, in a case where the alloying ratio (by mass) of the substrate of Ni and Mo as a whole is Ni/Mo=1/1.08, then the linear expansion coefficient of the alloy substrate 32 is around $9 \times 10^{-6}$/° C. In a case where the alloying ratio of the substrate of Ni and Mo as a whole is Ni/Mo=1/0.64, then the linear expansion coefficient of the alloy substrate 32 is around $10 \times 10^{-6}$/° C. Accordingly, in order to make the linear expansion coefficient of the alloy substrate 32 equal to that of the light absorbing layer 33 of CIGS, the alloying ratio of Ni and Mo of the alloy substrate 32 as a whole (Mo/Ni) shall be from 0.64 to 1.08. In particular, in view of the fluctuation in the linear expansion coefficient of the light absorbing layer 33, it is preferable to make the ratio Ni/Mo to be 1/1.

The alloy substrate 32 having a concentration gradient as above can be formed by the electroforming method, which is generally performed by: dipping a drum in an electrolytic bath; electrodepositing a thick metal on the drum; and peeling the electrodeposited metal from the drum to be a product as it is, or duplicated into copies. For example, in a case where an Ni foil is produced according to the electroforming method, a drum formed of titanium, stainless steel or the like is partly dipped in an electrolytic bath containing nickel sulfamate to thereby electrodeposit Ni on the surface of the drum, and continuously peeling it to give a nickel foil strip. As the anode, an insoluble anode (lead, antimony) is used, and the decrease in the nickel ion in the electrolytic bath is replenished by chemically dissolving nickel therein.

Figure 7A:
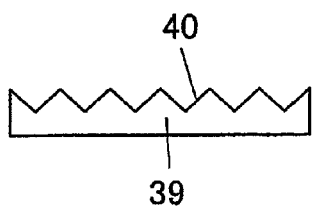
Figure 7B:
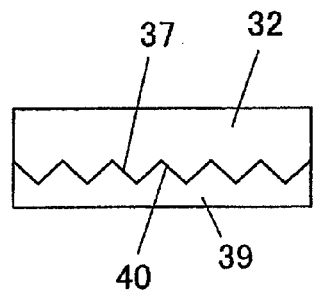
Figure 7D:
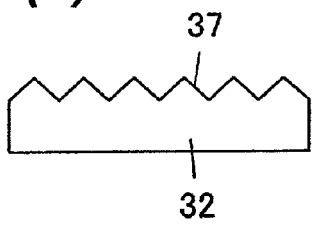

FIG. 7(a) to FIG. 7(d) show a process of forming the alloy substrate 32 by the electroforming method. First, a matrix die 39 having an inverted minute profile 40 that fits to unevenness 37 is formed by photolithography, EB, laser machining or the like, as shown in FIG. 7(a). Next, the matrix die 39 is dipped in an electrolytic bath containing Ni ion and Mo ion, and current is made to flow between the anode and the cathode to electrodeposit Ni and Mo on the surface of the inverted profile 40, thereby forming an alloy substrate 32 by the electroforming method as shown in FIG. 7(b). In this stage, the process is so designed that an Mo layer or an Mo-rich layer can deposit at the beginning (that is, in the layer near the inverted profile 40) and that the Mo concentration can decrease with the increase in the thickness of the alloy substrate 32 to deposit on the matrix die 39 and finally Ni can deposit thereon. Accordingly, the alloy substrate 32 obtained by peeling the matrix die 39, as shown in FIG. 7(c) and FIG. 7(d), has an Mo or Mo-rich surface layer on the side of the unevenness 37 and has an Ni layer on the lower surface side thereof.

Figure 8A:
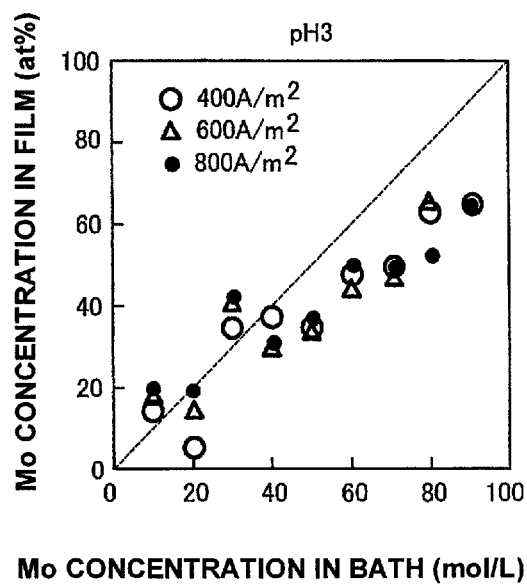
FIG. 8(a) is a graph showing Mo concentration in a film to be formed by the electroforming with an Ni—Mo electrolytic solution having a pH of 3.
Figure 8B:
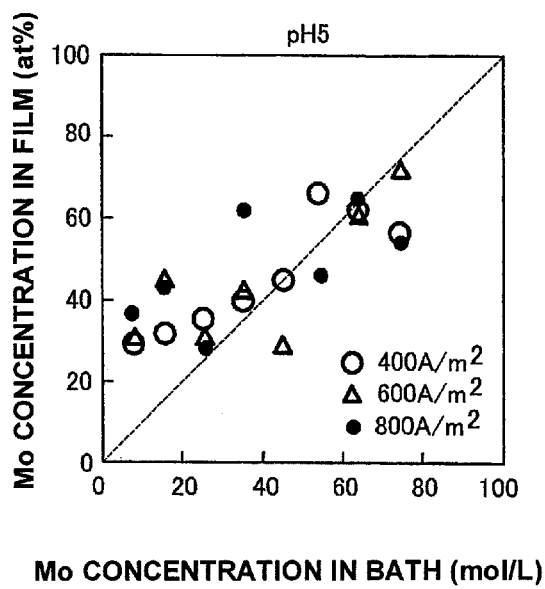
FIG. 8(b) is a graph showing Mo concentration in a film to be formed by the electroforming with an Ni—Mo electrolytic solution having a pH of 5.

In order to make the alloy substrate 32 deposit on the matrix die 39 with changing the composition ratio of Ni and Mo as described the above, the density of the current flowing between the anode and the cathode during electroforming may be controlled. FIG. 8(a) shows the Mo concentration (at. %) in the film to be formed by the electroforming with an Ni—Mo electrolytic solution having a pH of 3. FIG. 8(b) shows the Mo concentration (at. %) in the film to be formed by the electroforming with an Ni—Mo electrolytic solution having a pH of 5. In FIG. 8(a) and FIG. 8(b), the horizontal axis indicates the Mo concentration (mol/liter) in the bath of the electrolytic solution; and the vertical axis indicates the Mo concentration (at. %) in the film. White circles, triangles and black circles indicate the Mo concentration in the film at a current density of 400 A/m$^2$, 600 A/m$^2$ and 800 A/m$^2$, respectively. As is apparent from FIG. 8(a) and FIG. 8(b), the Mo concentration in the film increases with the increase in the Mo concentration in the bath, and the Mo concentration in the film varies depending on the current density. Accordingly, for forming the alloy substrate 32 having a gradient composition, the alloy substrate 32 may be formed by the electroforming method in which the current density is varied to thereby gradually vary the Mo/Ni concentration (composition ratio). In the region where the desired composition could not be obtained only by current control (the region where the composition ratio of Mo is extremely large, or the region where the composition ratio of Ni is extremely large), the Mo ion concentration in the electrolytic solution may be controlled by varying the current density with time. The method of controlling the Mo concentration in the electrolytic solution includes, for example, a method of gradually varying the Mo ion concentration in the electrolytic solution with time, and a method of putting, in sequence, the matrix die 39 in multiple electrolytic solutions each having a different Mo ion concentration.

Thus forming the alloy substrate 32 according to an electroforming method does not require vacuuming (process performed in a vacuum chamber), therefore enhancing the throughput, and the production cost for the alloy substrate 32 can be reduced. The side of the unevenness 37 of the alloy substrate 32 faces the light absorbing layer 33 and serves as a lower electrode, and the unevenness 37 can be formed to have a sharp profile through transfer from the matrix die 39. Accordingly, the light incident on the light absorbing layer 33 can be effectively scattered by the unevenness 37 so that the conversion efficiency of the CIS solar cell 31 can be enhanced.

Figure 7E:
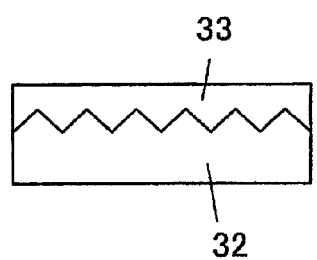

The light absorbing layer 33 is a polycrystalline thin film of a CIS chalcopyrite compound such as GIGS, CIGSS or CIS, and its thickness, as measured from the bottom or the lowermost point of the unevenness 37, is from 2 μm to 3 μm. The light absorbing layer 33 is formed on the upper surface of the alloy substrate 32 according to an ordinary method of a three-stage method, a selenization method, a multicomponent vapor deposition method, an MBE method or the like, as shown in FIG. 7(e). For example, in a three-stage method, an $(In,Ga)_2Se_3$ film is formed as the first layer, and then only Cu and Se are fed for film formation until the total composition of the film could be a Cu-excessive composition. Further, the film is again irradiated with a flux of In, Ge and Se to thereby have a final composition of an (In,Ga)-excessive composition. In a selenization method, an In/Cu(Ga)/Mo metal laminate film is formed through sputtering on the alloy substrate 32, and the laminate film is reacted with $H_2Se$ gas at a temperature not lower than 400° C. to form a $Cu(In,Ga)Se_2$ [CIGS] film.

In forming the light absorbing layer, in general, a substrate of soda lime glass is used to supply Na to the light absorbing layer from the substrate; but in this embodiment, the alloy substrate 32 is used, so that Na is directly introduced into the light absorbing layer 33 during the formation of the light absorbing layer 33.

Figure 7F:
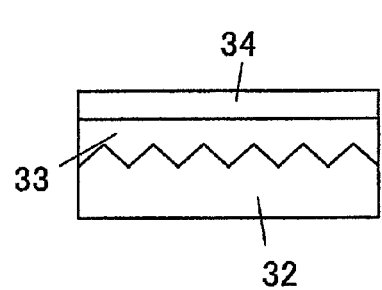

A buffer layer 34 is formed of CdS to have a thickness of 2 µm. However, in consideration of the global environment, a Cd-free material is desired; so that, for the buffer layer 34, preferably used is Zn(O,S,OH)x. The buffer layer 34 is formed in a mode of solution growth on the upper surface of the light absorbing layer 33 to have a thickness of from 0.05 µm (50 nm) to 0.1 µm (100 nm), for example, by a CBD (chemical bath deposition) method, as shown in FIG. 7(f).

Figure 7G:
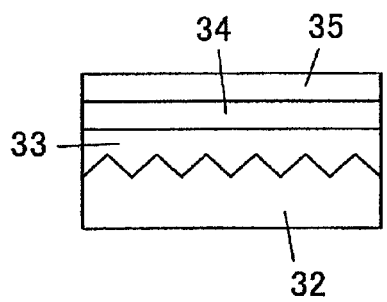

An upper electrode 35 is formed to have a thickness of 600 µm by a sputtering method, as shown in FIG. 7(g). The material of the upper electrode 35 is preferably ZnO from the viewpoint of the cost thereof; however, a conductive oxide such as $In_2O_3$, $SnO_2$, CdO, $Cd_2SO_4$, $TiO_2$, $Ta_2O_5$, $Bi_2O_3$, $MoO_3$ or $Na_xWO_3$ is also available. In addition, it is available any of mixtures of these compounds, or those doped with an element capable of varying the conductivity thereof (dopant) (for example, ITO, IZO, FTO, AZO, BZO, ZnO with minor Al added thereto). In a case where the film of the above-mentioned compound is formed to have a two-layered structure of a high-resistance layer and a low-resistance layer, then it is effective for shunt path reduction in the upper electrode 35.

The lead electrode 36 is formed of an aluminum material to have a thickness of from 1 µm to 3 µm. For example, an opening for forming the lead electrode 36 is formed in a mask, and the mask is put on the upper electrode 35, as positioned thereon, and an electrode material is supplied to the upper electrode 35 via the opening of the mask to thereby form the lead electrode 36.

In the CIS solar cell according to the first embodiment of the invention, the alloy substrate 32 is formed by the electroforming method, so that the alloy substrate 32 having unevenness 37 can be formed easily and with low cost. Moreover, the unevenness are formed to have a sharp profile with accuracy. The upper surface of the alloy substrate 32 is formed of Mo and serves as a lower electrode, so that it is unnecessary to further provide an additional lower electrode on the upper surface of the alloy substrate 32, and the light absorbing layer 33 can be formed directly on the unevenness 37 of the alloy substrate 32. Accordingly, the light incident on the light absorbing layer 33 is scattered by the unevenness 37, spread inside the light absorbing layer and subjected to the absorption, so that the conversion efficiency of the CIS solar cell is enhanced.

In the CIS solar cell of the first embodiment, the alloy substrate 32 is an alloy of Ni and Mo, and its composition varies in the thickness direction thereof in such a manner that the Mo concentration becomes high at the surface of the alloy substrate 32, so that a lower electrode (ohmic electrode) can be formed on the surface of the alloy substrate 32. In addition, since the Mo concentration is high at the surface of the alloy substrate 32, the lattice constant matching is easily established between the surface of the alloy substrate 32 and the light absorbing layer 33 during the formation of the light absorbing layer 33. Further, since the alloy substrate 32 is formed of an alloy, the alloying ratio can be so controlled that the thermal expansion coefficient of the allay substrate 32 could be almost equal to the thermal expansion coefficient of the light absorbing layer 33, and the light absorbing layer 33 can be thereby prevented from cracking or peeling.

Second Embodiment

Next, a second embodiment of the invention will be described. The constitution of the CIS solar cell is the same as that in the first embodiment, and the graphical presentation and explanation will be omitted.

Figures 9A, 9B:
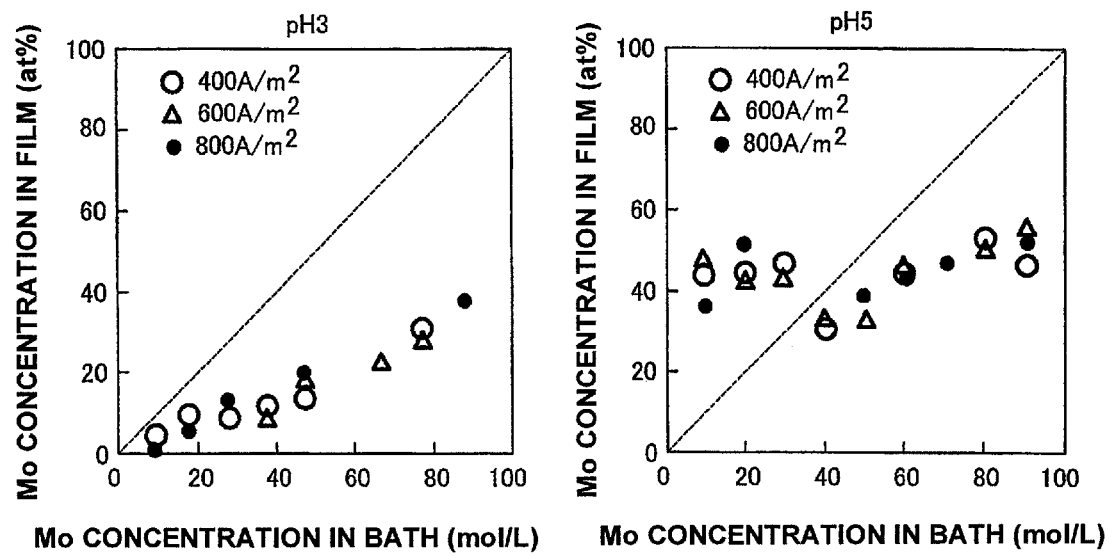
FIG. 9(a) is a graph showing Mo concentration in a film to be formed by the electroforming with an Ni—Mo electrolytic solution having a pH of 3, according to a second embodiment of the invention.
FIG. 9(b) is a graph showing Mo concentration in a film to be formed by the electroforming with an Ni—Mo electrolytic solution having a pH of 5.

In the first embodiment, the alloy substrate 32 is an alloy of Mo and Ni; but in the second embodiment, the alloy substrate 32 is formed of an alloy of Mo and Co. In this case, the lower surface side is formed of Co, and the upper surface side having the unevenness 37 is an Mo layer or an Mo-rich layer. Also in the case of the Mo—Co alloy, the Mo concentration in the film varies depending on the Mo concentration in the bath and the current density, as shown in FIG. 9(a) and FIG. 9(b). Accordingly, the Mo concentration in the alloy substrate 32 can be varied by varying the current density and the Mo concentration in the bath during the electroforming.

In order that the linear expansion coefficient of the alloy substrate 32 of an Mo—Co alloy is made equal to the linear expansion coefficient of the light absorbing layer 33 so as to prevent the light absorbing layer from cracking or peeling due to temperature change, the alloying ratio of Co/Mo may be controlled as follows. For example, in a case where the light absorbing layer 33 is CIGS, its linear expansion coefficient is from $9\times10^{-6}/°$ C. to $10\times10^{-6}/°$ C. In a case where the linear expansion coefficient of Co is $12.4\times10^{-6}/°$ C., and the linear expansion coefficient of Mo is $5.2\times10^{-6}/°$ C., the linear expansion coefficient of the alloy substrate 32 is around $9\times10^{-6}/°$ C. under a condition that the alloying ratio (by mass) of the substrate of Co and Mo as a whole (Co/Mo) is 1/0.92. In a case where the alloying ratio of the substrate of Co and Mo as a whole (Co/Mo) is 1/0.52, the linear expansion coefficient of the alloy substrate 32 becomes around $10\times10^{-6}/°$ C. Accordingly, in order to make the linear expansion coefficient of the alloy substrate 32 equal to that of the light absorbing layer 33 of CIGS, the alloying ratio of Co and Mo of the alloy substrate 32 as a whole (Mo/Co) shall be from 0.52 to 0.92.

Except the alloy composition of Ni—Mo or Co—Mo, any one or more materials of Ni, Cu, Ti, Fe, W, Cr, Al, Au, Nb, Ta, V, Pt, Pb and the like may be employed as the composition on the lower surface side and Mo is employed as the composition on the upper surface side, and the composition ratio of the alloy layer as a whole may be so controlled that the linear expansion coefficient thereof can be almost equal to that of the light absorbing layer 33.

Third Embodiment

Figure 10:
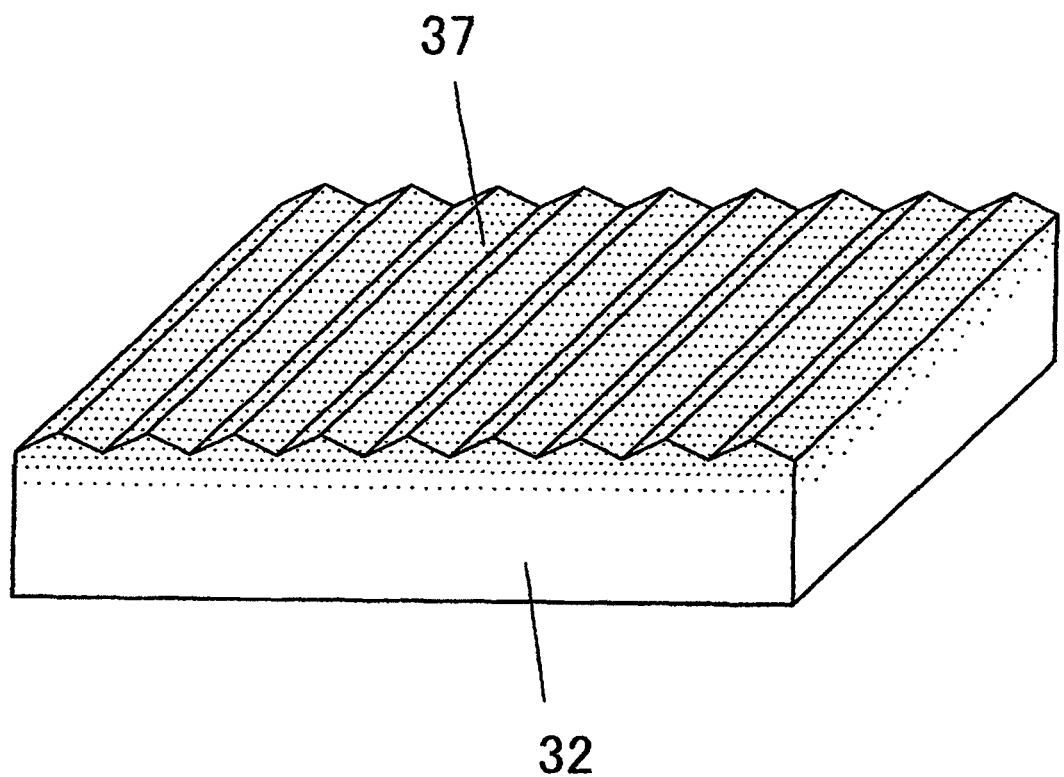
FIG. 10 is a perspective view showing an alloy substrate used in a CIS solar cell according to a third embodiment of the invention.

FIG. 10 is a perspective view showing an alloy substrate 32 for use in the CIS solar cell according to a third embodiment of the invention. In the alloy substrate 32, the upper surface is formed with minute grooves having triangular cross sections, as shown in FIG. 10. Also such unevenness 37 can scatter light to enhance the conversion efficiency of a CIS solar cell.

Fourth Embodiment

Figure 11:
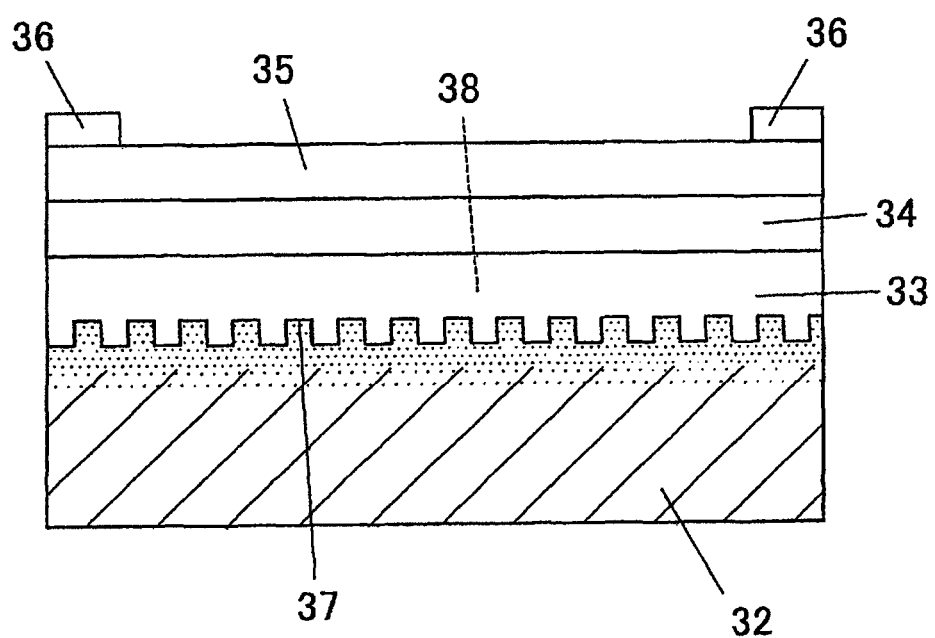
FIG. 11 is a section view schematically showing structure of a CIS solar cell according to a fourth embodiment of the invention.

FIG. 11 is a cross-sectional view showing a constitution of the CIS solar cell according to a fourth embodiment of the invention. In this embodiment, the unevenness 37 are formed of convexes and concaves having rectangular cross sections. They may also be grooves having rectangular cross sections. Also in this case, the unevenness 37 may be formed in such a manner that ones having the same shape are aligned at a constant pitch or at random, or ones having different shapes are formed at random. The unevenness 37 of this type have inferior light scattering property, but have superior for preventing the peeling between the light absorbing layer 33 and the alloy substrate 32.

The unevenness 37 may have such a shape that is able to control the crystal growth of the light absorbing layer 33 to be formed thereon.

The invention claimed is:

1. A CIS solar cell, comprising:
a substrate having an upper surface formed with unevenness;
a CIS light absorbing layer adapted to absorb light; and
an upper electrode disposed above the CIS light absorbing layer,
wherein the CIS light absorbing layer is disposed on the substrate and in contact with the unevenness, so that the substrate serves as a lower electrode,
wherein the substrate is comprised of an alloy of Ni and Mo or Co and Mo,
wherein an alloy composition of an upper side of the substrate is different from an alloy composition of a lower side of the substrate,
wherein the alloy composition of the substrate is configured so that the linear expansion coefficient of the alloy substrate as a whole is equal to the linear expansion coefficient of the CIS light absorbing layer, and
wherein a lower surface side of the substrate comprises a Ni-rich or a Co-rich phase and the upper surface side of the substrate comprises a Mo-rich phase and a region of the substrate between the lower surface side and the upper surface side of the substrate comprises Mo diffused with Ni or Co wherein the Mo concentration becomes higher from the lower surface side of the substrate to the upper surface side of the substrate, the upper surface being in contact with the CIS light absorbing layer.

2. The CIS solar cell as set forth in claim 1, wherein:
the unevenness is formed by pyramidal convexes or concaves.

3. The CIS solar cell as set forth in claim 2, wherein:
an apex angle of the pyramidal convexes or concaves is 110 degrees.

4. The CIS solar cell as set forth in claim 1, wherein:
a height of the unevenness is no greater than thickness of the light absorbing layer.

5. The CIS solar cell as set forth in claim 1, wherein:
the substrate is formed by electroforming.

6. A method of manufacturing the CIS solar cell as set forth in claim 1, comprising:
subjecting a matrix die on which an inverted profile of the unevenness is formed to electroforming to deposit a substrate material on an upper surface of the matrix die;
removing the matrix die from a substrate formed on the upper surface of the matrix die;
forming the light absorbing layer on the upper surface of the substrate; and
forming the upper electrode above the light absorbing layer.

7. A CIS solar cell, comprising:
a substrate having an upper surface formed with unevenness;
a CIS light absorbing layer adapted to absorb light; and
an upper electrode disposed above the CIS light absorbing layer,
wherein the CIS light absorbing layer is disposed on the substrate and in contact with the unevenness, so that the substrate serves as a lower electrode,
wherein the substrate is comprised of an alloy of Ni and Mo or Co and Mo, and
wherein a lower surface side of the substrate comprises a Ni-rich or a Co-rich phase and the upper surface side of the substrate comprises a Mo-rich phase and a region of the substrate between the lower surface side and the upper surface side of the substrate comprises Mo diffused with Ni or Co wherein the Mo concentration becomes higher from the lower surface side of the substrate to the upper surface side of the substrate, the upper surface being in contact with the CIS light absorbing layer.

* * * * *